United States Patent
Chang et al.

(10) Patent No.: US 8,427,879 B2
(45) Date of Patent: Apr. 23, 2013

(54) METHOD FOR ENABLING A SONOS TRANSISTOR TO BE USED AS BOTH A SWITCH AND A MEMORY

(75) Inventors: Ting-Chang Chang, Taipei Hsien (TW); Shih-Ching Chen, Taipei Hsien (TW); Te-Chih Chen, Taipei Hsien (TW); Fu-Yen Jian, Taipei Hsien (TW); Yong-En Syu, Taipei Hsien (TW)

(73) Assignee: Acer Incorporated, Taipei Hsien (TW)

( * ) Notice: Subject to any disclaimer, the term of this patent is extended or adjusted under 35 U.S.C. 154(b) by 317 days.

(21) Appl. No.: 12/644,575

(22) Filed: Dec. 22, 2009

(65) Prior Publication Data
US 2011/0096610 A1 Apr. 28, 2011

(30) Foreign Application Priority Data
Oct. 27, 2009 (TW) .................... 98136270 A (51) Int. Cl.
*G11C 11/34* (2006.01)
*G11C 16/04* (2006.01)

(52) U.S. Cl.
USPC ............ 365/185.24; 365/185.18; 365/185.28; 365/185.29; 365/182

(58) Field of Classification Search ............. 365/185.01–185.33, 182
See application file for complete search history.

(56) References Cited

U.S. PATENT DOCUMENTS

| | | | |
|---|---|---|---|
| 6,916,708 B2* | 7/2005 | Tao et al. | 438/257 |
| 7,099,181 B2* | 8/2006 | Ahn et al. | 365/149 |
| 7,319,613 B2* | 1/2008 | Forbes | 365/185.08 |
| 7,893,426 B2* | 2/2011 | Wunderlich et al. | 257/25 |
| 8,169,823 B2* | 5/2012 | Bae | 365/185.05 |

* cited by examiner

*Primary Examiner* — Kretelia Graham
(74) *Attorney, Agent, or Firm* — C. G. Mersereau; Nikolai & Mersereau, P.A.

(57) ABSTRACT

There is a method for enabling a SONOS transistor to be used as both a switch and a memory. FN tunneling is carried out through the source or drain of the transistor, so as to further change the state of electrons stored in an upper charge storage layer adjacent to the drain or source, and the variation in gate-induced drain leakage is used to recognize the memory state of the drain and source. A stable threshold voltage of the transistor is always maintained during this operation. The present invention enables one single transistor having dual features of switch and memory, while being provided with a two-bit memory effect, thus providing a higher memory density in comparison with a general transistor.

8 Claims, 10 Drawing Sheets

METHOD FOR ENABLING A SONOS TRANSISTOR TO BE USED AS BOTH A SWITCH AND A MEMORY

FIELD OF THE INVENTION

The present invention is related to a method for enabling a SONOS transistor to be used as both a switch and a memory, particularly to a method allows the SONOS transistor to maintain in a stable threshold voltage.

BACKGROUND

For a general flash type nonvolatile memory, presently, a way to recognize the memory state is the application of applying a reading voltage $V_{read}$ on the gate, which the reading voltage was set between the programming threshold voltage and erasing threshold voltage, with the corresponding currents induced by the reading voltage ones could recognize the memory state as "0" or "1". The voltage difference between the programming and erasing threshold voltages (also referred as memory window) may have an effect on the probability of misrecognition of the memory state; the misrecognition of memory state could be avoided only in the case of a large scale memory window. Once the threshold voltage of the memory changes, the transistor is incapable of switching between ON and OFF properly, thus incapable of being used as a switch.

Conventionally, there are two primary ways to program the flash type nonvolatile memory: FN tunneling (Fowler-Nordheim tunneling) and channel-hot-electron programming, while the way to erase is mainly FN tunneling. Generally, the advantage of using channel-hot-electron to program SONOS memory is this could provide a two-bit memory effect, in which electrons are stored in the silicon nitride ($Si_3N_4$) layer adjacent above the source or drain, in such a way one single memory cell is allowed to store information at the source or the drain individually, thus achieving the two-bit effect. The disadvantage, however, is large power consumption required when the channel-hot-electron programming is carried out; the power consumption would be a significant problem if several memory cells are programmed at the same time. In addition, the memory may be deteriorated when it is programmed with channel-hot-electron, thus reducing reliability. As for FN tunneling programming, the advantage thereof is no necessity for large power consumption. However, the two-bit memory effect may be not achieved due to the fact that electrons will be injected into the silicon nitride layer over the whole channel after FN tunneling.

In view of the problems in the prior art and for solving them concurrently, the inventor proposes a method for enabling a SONOS transistor to be used as both a switch and a memory, on the basis of research and development for many years as well as much practice experience, used as the realizing way and basis to solve above problems.

SUMMARY OF THE INVENTION

The present invention provides a method for programming and erasing a nonvolatile memory, in which FN tunneling is carried out on the source or the drain of a SONOS transistor, so as to change the state of electrons stored in an upper charge storage layer adjacent to the drain or source, and the variation in gate-induced drain leakage (GIDL) is used to recognize the memory state of the drain and source, in such a way a two-bit memory effect may be provided for the SONOS transistor, achieving a higher memory density. In comparison with a general two-bit effect, obtained with the use of channel-hot-electron programming which requires large power consumption in the conventional art, the power consumption in using this method for programming and erasing the nonvolatile memory may be less.

Furthermore, the present invention provides a method for enabling a SONOS transistor to be used as both a switch and a memory, in which said FN tunneling at the source or drain of SONOS transistor is used. In this case, the variation of the charge in the charge storage layer over the channel may not so much, while the FN tunneling may be carried out principally above the source or drain of the transistor. In operation, a threshold voltage of the transistor is always maintained, in such a way not only the function of the memory is provided for the SONOS memory, but also the feature of the switch is still preserved therefor. Consequently, when the transistor is used in a logic circuit or used as a pixel switch in LCD to switch over, additional data may be stored in the same transistor and flexibility in circuit design and use may be enhanced.

In this connection, the SONOS transistor comprises a gate, a charge storage layer, a source, a drain, and a substrate. Moreover, the method for enabling a SONOS transistor to be used as both a switch and a memory comprises steps as follows:

Firstly, either applying a larger first operating voltage or applying a first operating voltage for a longer duration time, the source and drain are grounded and electrons in the channel being injected into the charge storage layer of the transistor. At this moment, a gate-induced drain leakage (GIDL) and a threshold voltage ($V_t$) of the transistor increase. After the threshold voltage has increased from a first threshold voltage to a second threshold voltage, the provision of the first operating voltage should be stopped. Then, this step is finished.

Erasing operation: Firstly, the erasing operation is performed with respect to the drain and the source, respectively, selectively applying, an erasing voltage on either the source or the drain. Thereinafter, the drain is taken as an example. After the erasing voltage is provided on the drain and meanwhile the gate and source are grounded, the electrons in the charge storage layer over the proximity of the drain may be erased accordingly (or the holes may be injected into the charge storage layer). The operation for the source is similar. In this way, GIDL at the drain or source may be restrained, while electrons may be stored above the source and drain, respectively. Therefore, the SONOS transistor could be used as a two-bit memory and thus a higher memory density may be provided.

Programming operation: The programming operation is performed by applying a programming voltage on the gate with the source and drain being grounded. The value of threshold voltage of the transistor may be not affected owing to the programming voltage is smaller than the first operating voltage (or a relatively short duration operating time). Nevertheless, large electric fields may be generated in the vicinity of gate-drain and gate-source, in such a way that electrons may be injected into the charge storage layer right above the drain and the source, thus forming GIDL again.

Reading operation: For reading the memory state of the source, a first determining voltage and a second determining voltage may be applied to the gate and the source, respectively, with the drain being grounded. The gate-induced drain leakage (GIDL) is used to determine the memory state of the source. Likewise, the memory state of the drain may be read by applying the first determining voltage and the second determining voltage to the gate and the drain, respectively, with the source being grounded. The gate-induced drain leakage (GIDL) is used to determine the memory state of the drain.

The threshold voltage of the transistor may be maintained during operation owing to the primary use of principle of single-sided FN tunneling in the present invention. Further, the problem that miniaturization in the prior art is restricted by the size of pinch-off region may be solved, so as to provide a design which is easier to be miniaturized.

It is another object of the present invention to provide an operating method for a memory having a two-bit memory effect.

It is yet another object of the present invention to provide an operating method allowing for maintaining the threshold voltage of a memory.

In addition, the present invention further provides an operating method, which operates a memory with the use of FN tunneling, achieving the object of power saving.

Additionally, the present invention further provides an operating method allowing for the enlargement of the range of reading voltage.

Accordingly, a method for enabling a SONOS transistor to be used as both a switch and a memory, provided in accordance with the present invention, may possess one or more advantages as follows:
1. maintaining the threshold voltage of the memory;
2. could be applied in a flat panel display;
3. a relatively small operating voltage in comparison with the operating voltage used in the conventional FN tunneling;
4. comprising a two-bit memory effect, and less power consumption in comparison with channel-hot-electron programming in the prior art;
5. better reliability in comparison with channel-hot-electron programming,
6. a larger region of reading voltage, further reducing probability of misrecognition, owing to the use of variation in GIDL for identifying the memory state, in comparison with the conventional way to identify the memory state by means of the variation in threshold voltage.

A further comprehension and understanding of the technical features and effects of the present invention may be acquired by referring to the embodiments, taken in conjunction with the following detailed description thereof.

DETAILED DESCRIPTION

In the following, a method for enabling a SONOS transistor to be used as both a switch and a memory according to the preferred embodiment of the present invention will be described with reference to related drawings. For better understanding, identical elements will be indicated with like numerals in the following embodiments.

Figure 1:
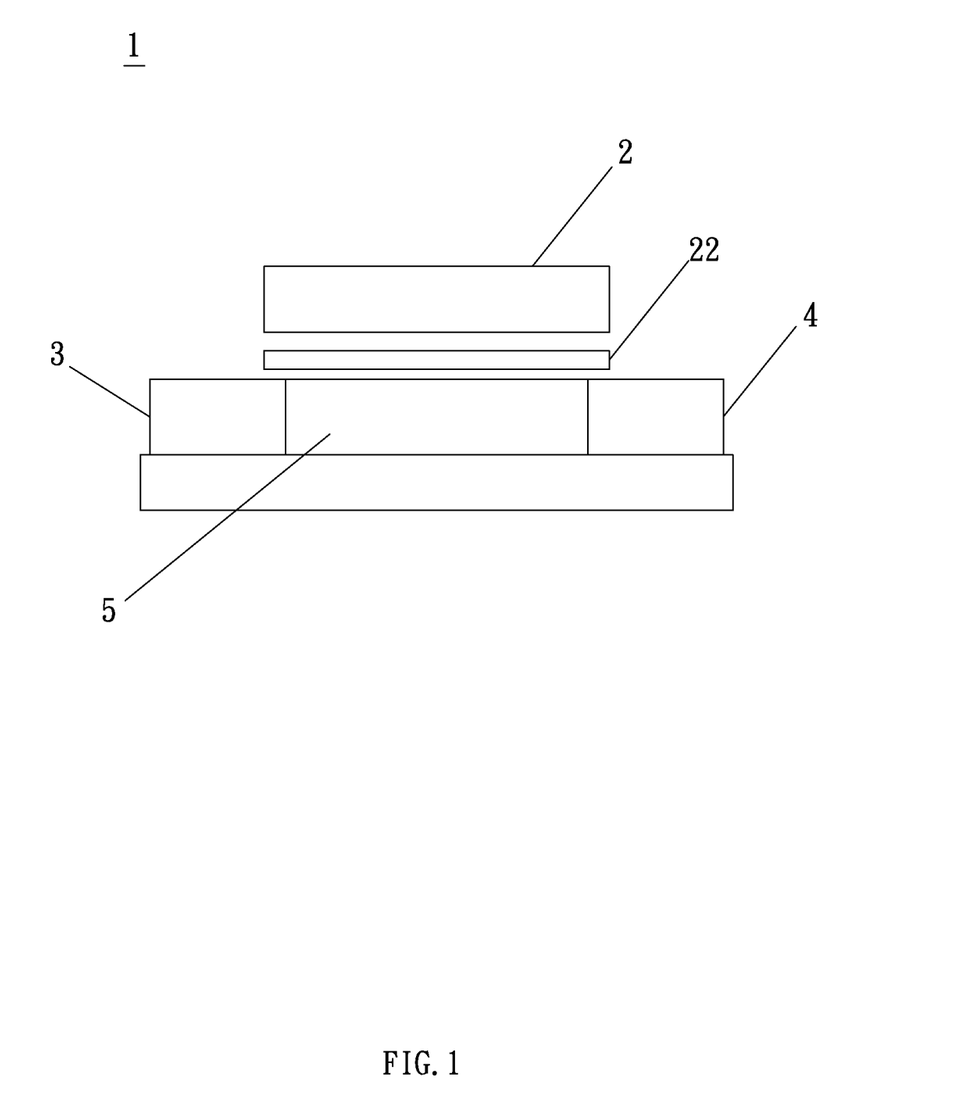
FIG. 1 is a diagram of a nonvolatile memory with SONOS (Silicon-Oxide-Nitride-Oxide-Silicon) structure of the present invention.

Referring to FIG. 1, there is shown a diagram of a nonvolatile memory with SONOS (Silicon-Oxide-Nitride-Oxide-Silicon) structure of the present invention. A transistor 1 comprises a gate 2, a charge storage layer 22, a source 3, a drain 4, and a substrate 5. The transistor 1 may be a thin-film transistor or field-effect transistor. In this case, the charge storage layer of the SONOS transistor could be a silicon nitride layer, aluminum oxide layer, tantalum oxide layer, or titanium oxide layer.

Figure 2:
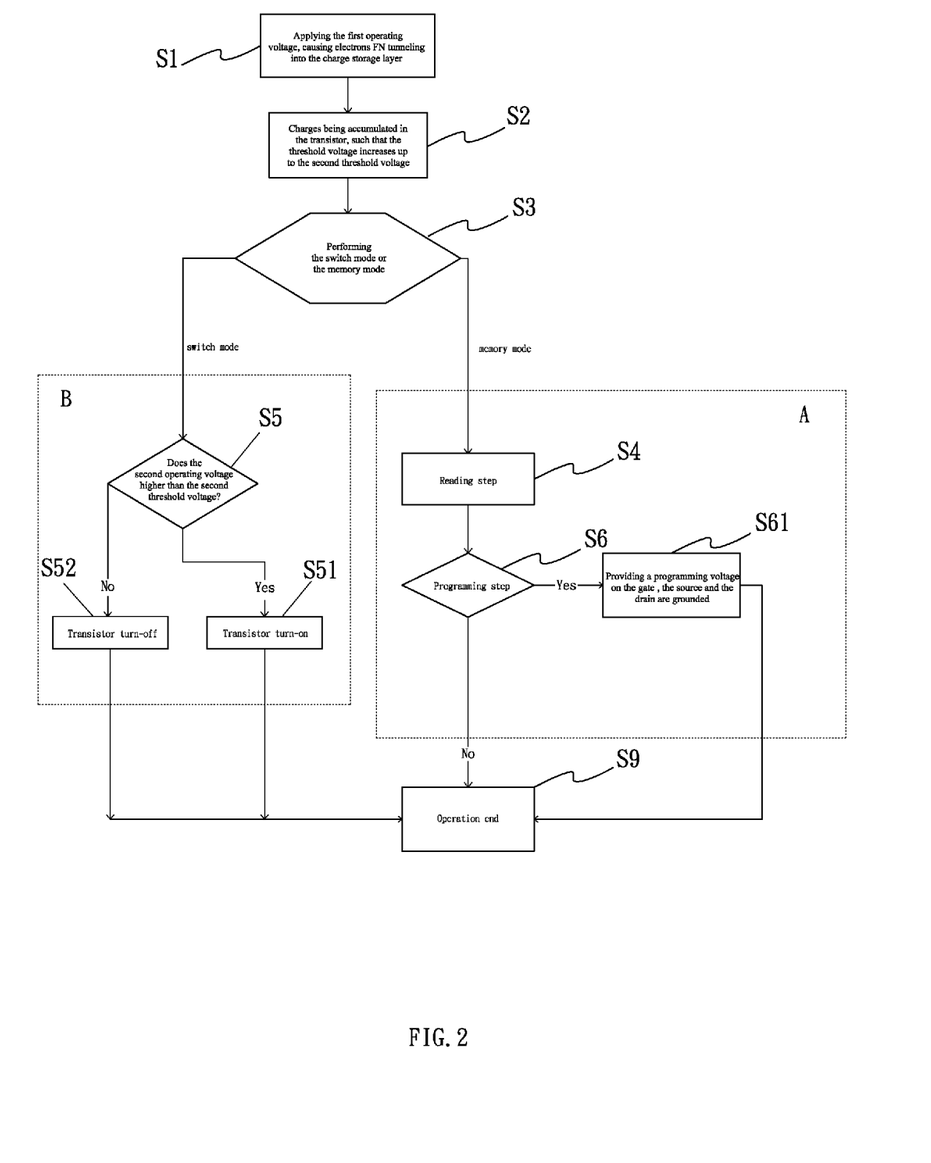
FIG. 2 is an operation flow chart of one preferred embodiment of the present invention.

Referring to FIG. 2, there is shown an operation flow chart of another preferred embodiment of the present invention. The present invention is operated on a nonvolatile memory with SONOS (Silicon-Oxide-Nitride-Oxide-Silicon) structure, a transistor 1 comprising a gate 2, a charge storage layer 22, a source 3, a drain 4, and a substrate 5. Firstly, in step S1, a first operating voltage is provided to the gate 2, causing electrons FN tunneling into the charge storage layer 22, and accumulating in the charge storage layer 22 gradually, in such a way that the value of a threshold voltage of the transistor 1 may raise up from a first threshold voltage to a second threshold voltage (step S2). This step is performed to confirm that the threshold voltage of the transistor 1 may be maintained at the second threshold voltage when this transistor is operating. Step S3 may be performed to determine whether the transistor 1 is operated in a switch mode or a memory mode. If the transistor will be operates as a switch, then the flow will proceed to the operation block B; if it operates as a memory, then the flow will proceed to the operation block A. In step S5, applying a second operating voltage on the gate 1 and determining if the second operating voltage is larger than the second threshold voltage. If the second operating voltage is smaller than the second threshold voltage, the transistor 1 may be presented in a turn-off state (step S52), or if it's not the transistor 1 may be presented in a turn-on state (step S51). Subsequently, the flow will proceed to step S9 directly to end the operation.

If step S3 is performed to determine that the transistor 1 is used in the memory mode, the flow will proceed to the memory operation block A, so as to continue to following steps. In step S4, reading the memory state of the transistor 1 is performed by the application of a first determining voltage, which applies on the gate 2, and a second determining voltage, which applies on the drain 4 or source 3, so as to generate a gate-induced drain leakage (GIDL). The variation in the GIDL may be used to determine the state of information stored in the source 3 or drain 4. Step S6 is a programming step, in which a programming voltage is applied to the gate 2, while the source 3 and the drain 4 are grounded (step S61), in such a way that electrons may be injected into the charge storage layer 22. Finally, the operation is ended in step S9.

Figure 3:
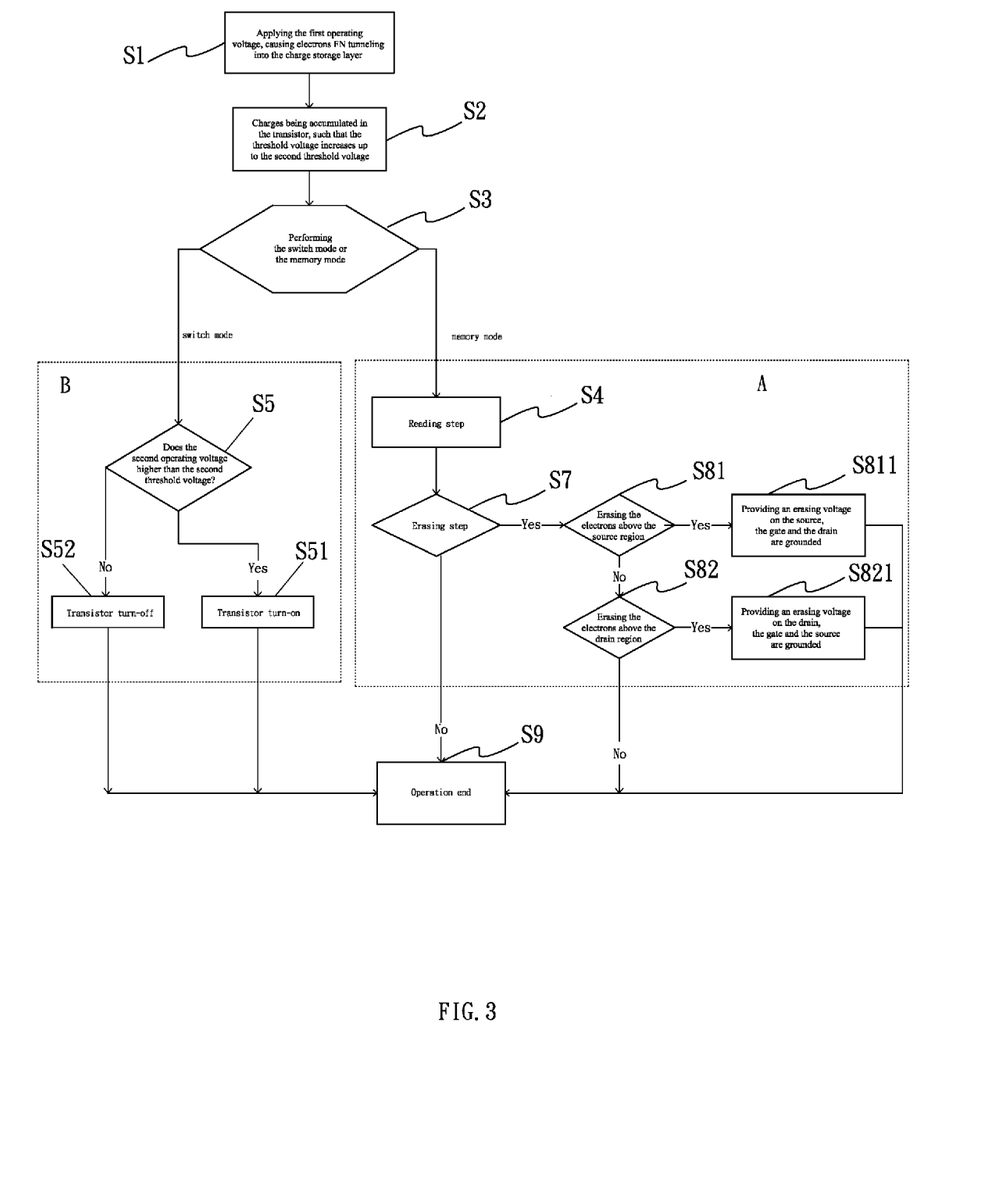
FIG. 3 is an operation flow chart of another preferred embodiment of the present invention.

Referring to FIG. 3, there is shown an operation flow chart of another preferred embodiment of the present invention.

The present invention is operated on a nonvolatile memory with SONOS (Silicon-Oxide-Nitride-Oxide-Silicon) structure, the transistor 1 comprising a gate 2, a charge storage layer 22, a source 3, a drain 4, and a substrate 5. Firstly, in step S1, a first operating voltage is provided on the gate 2, causing electrons FN tunneling into the charge storage layer 22, and accumulating in the charge storage layer 22 gradually, in such a way that the value of a threshold voltage of the transistor 1 may raise up from a first threshold voltage to a second threshold voltage (step S2). This step is performed to confirm that the threshold voltage of the transistor 1 may be maintained at the second threshold voltage when the transistor 1 is in operation.

Step S3 may be performed to determine whether the transistor 1 is operated in a switch mode or a memory mode. If the transistor 1 is used in the switch mode, the flow will proceed to the operation block B, and then if it is used in the memory mode, the flow will proceed to the operation block A. In step S5, applying a second operating voltage to the gate 1 and determining if this second operating voltage is larger than the second threshold voltage or not. If the second operating voltage is smaller than the second threshold voltage, the transistor 1 may be presented in a turn-off state (step S52), and then if it's not the transistor 1 may be presented in a turn-on state (step S51). Subsequently, the flow will proceed to step S9 directly to end the operation.

If step S3 is performed to determine that the transistor 1 is used in the memory mode, the flow will proceed to the memory operation block A, so as to continue to following steps. In step S4, reading the memory state of the transistor 1 is performed by the application of a first determining voltage on the gate 2, and a second determining voltage to the drain 4 or source 3, respectively, so as to generate a gate-induced drain leakage (GIDL). The variation in the GIDL may be used to determine the state of information stored in the source 3 or drain 4. Step S7 is an erasing step, by which the electrons in the charge storage layer 22 over either the source 3 or the drain 4 may be selectively erased according to the user's requirement. If it is required to erase the source 3 (step S81), the information stored above the source 3 may be erased by applying an erasing voltage on the source 3 as well as grounding the gate 1 and the drain 4 (step S811). Moreover, the application of the erasing voltage to the source 3 may restrain the generation of GIDL around the source 3 region. If it is required to erase the information stored at the drain 4, the flow will proceed to step S82. The electrons in the charge storage layer 22 over the drain 4 may be erased by applying an erasing voltage to the drain 4 as well as grounding the gate 1 and the source 3 (step S821). Finally, the operation is ended in step S9.

Figure 4:
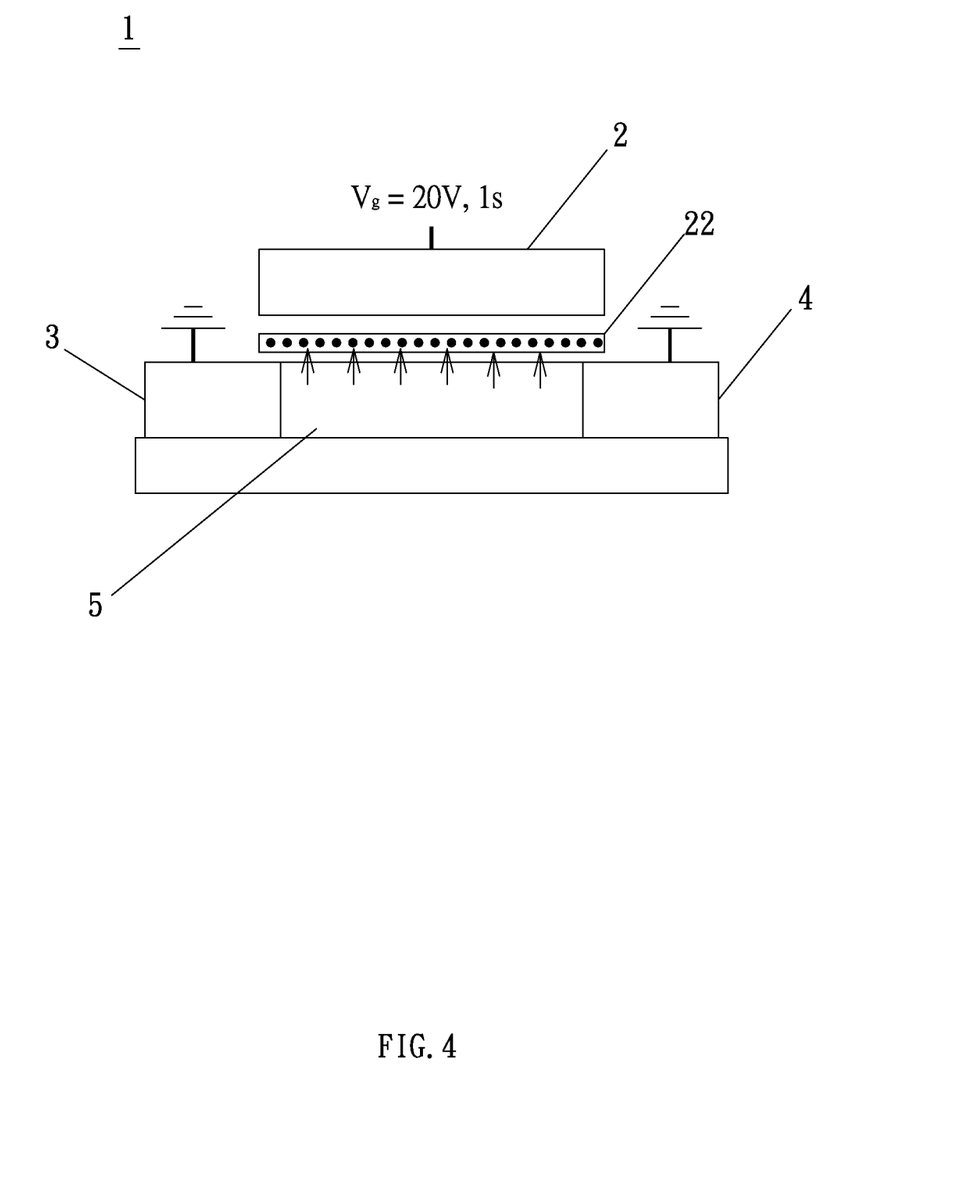
FIG. 4 is a diagram showing the first operation according to one preferred embodiment of the present invention.
Figure 5:
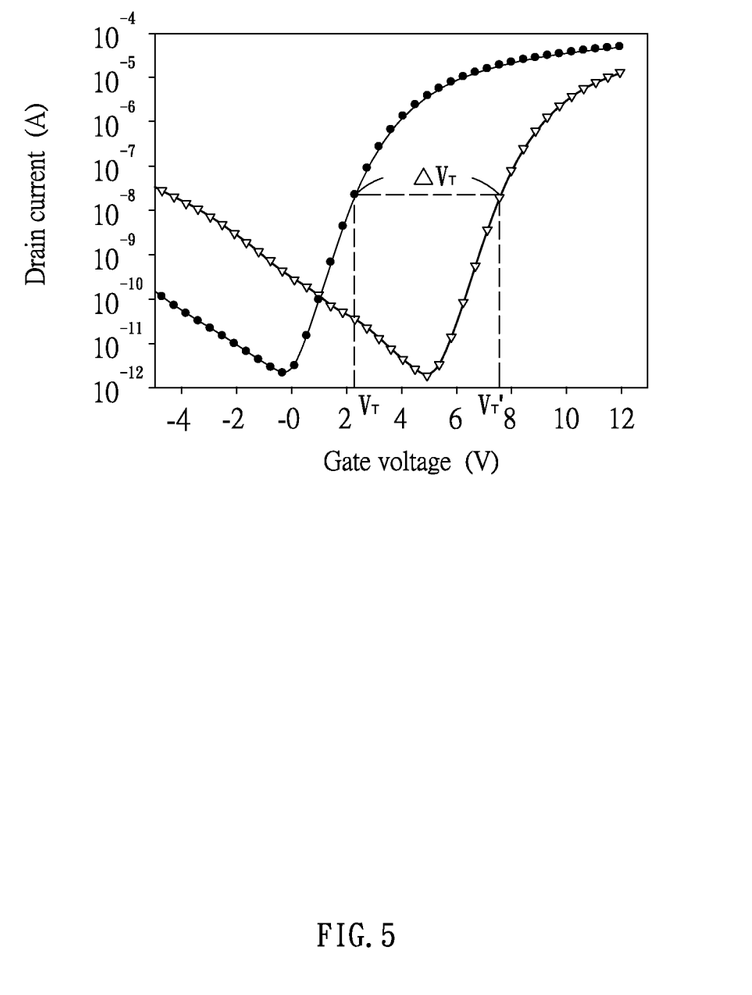
FIG. 5 is a diagram showing the current-voltage characteristics under S1 operation according to one preferred embodiment of the present invention.

Referring FIGS. 4 and 5, there are shown in FIG. 4 a diagram of the first operation according to one preferred embodiment of the present invention, and in FIG. 5 the current-voltage characteristics under S1 operation according to one preferred embodiment of the present invention is shown. The present invention is operated on a transistor 1, this transistor being presented as a SONOS memory structure. Further, the transistor 1 comprises a gate 2, a charge storage layer 22, a source 3, a drain 4, and a substrate 5. In this case, this charge storage layer of the SONOS transistor could be a silicon nitride layer, aluminum oxide layer, tantalum oxide layer, or titanium oxide layer. In this embodiment, the first operating voltage is 20V and operating time is 1 second, electrons may pass through the top of the channel into the charge storage layer 22, in the case of grounded source 3 and drain 4, on the basis of FN tunneling principle. The accumulation of charge may cause the change of voltage-current characteristics of the transistor 1, while the value of a threshold voltage of the transistor 1 may raise up to a second threshold voltage $V_T'$ from a first threshold voltage $V_T$ gradually. When the value of the threshold voltage is stabilized at the second threshold voltage $V_T'$, it is considered that a saturation state is obtained, allowing for stopping the provision of the first operating voltage. At this moment, a relatively large GIDL may be generated due to the electrons near the source 3 and the drain 4. FIG. 5 shows a current-voltage curve for the operation in. FIG. 4. In FIG. 5, it is clear that the value of the threshold voltage may increase up to the second threshold voltage $V_T'$ from the first threshold voltage $V_T$ after a longer operation time or under a relatively larger operating voltage. At this moment, the provision of the first operating voltage may be stopped. Subsequent operations are all performed under the second threshold voltage $V_T'$.

Figure 6:
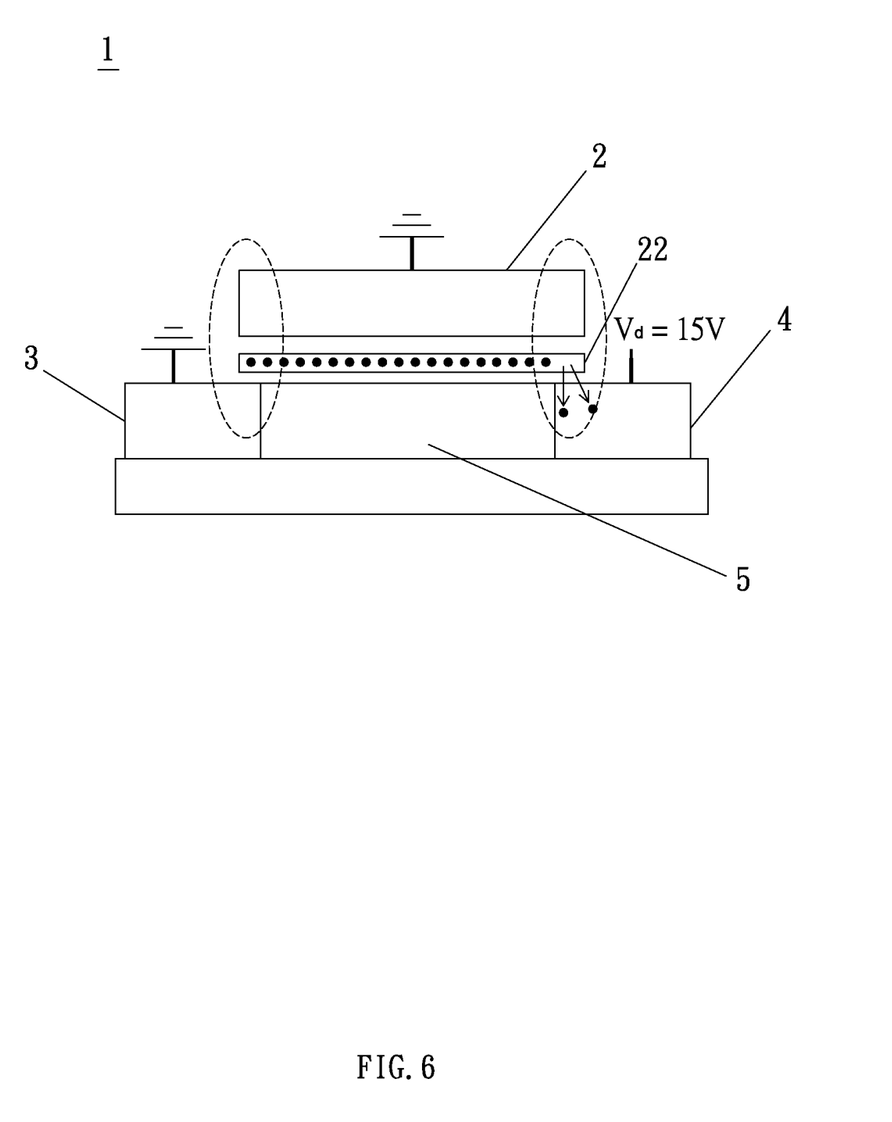
FIG. 6 is a diagram showing the erasing operation according to one preferred embodiment of the present invention.
Figure 7:
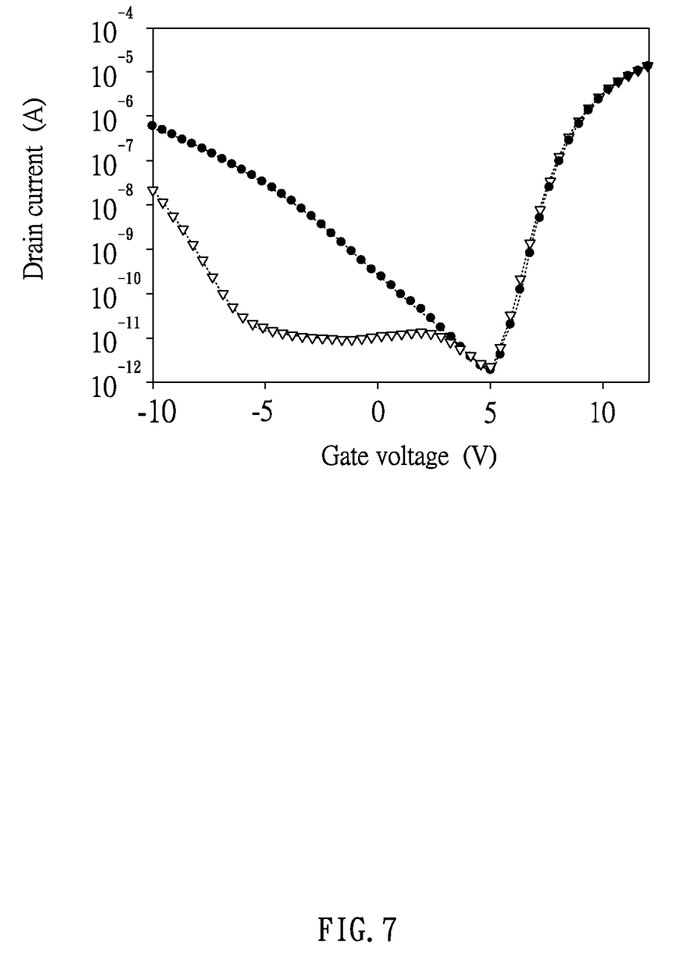
FIG. 7 is a diagram showing the current-voltage characteristics under the erasing operation according to one preferred embodiment of the present invention.

Referring to FIGS. 6 and 7, there are shown in FIG. 6 a diagram of the erasing operation according to one preferred embodiment of the present invention, and in FIG. 7 the current-voltage characteristics under the erasing operation according to one preferred embodiment of the present invention. In this embodiment, an erasing voltage, which is at the value of 15 volts are present in this embodiment, is applied to the drain 4, for the duration time of 1 millisecond (ms), while the gate 2 and the source 3 are presented in the grounded state. In this case, the electrons in the charge storage layer 22 over the proximity of the drain 4 may be erased (or the holes may be injected into the charge storage layer 22). The value of GIDL may vary due to the application of the erasing voltage applied on the drain 4. Referring to FIG. 7, it is evident that GIDL reduces significantly, while the threshold voltage of the transistor 1 is not affected due to the fact that electrons affected in this step are a small number of electrons around the drain 4. Similarly, it is also possible to apply the erasing voltage, which is also at the value of 15 volts, to the source 3 for the duration time of 1 ms, while the gate 1 and the drain 4 are presented in the grounded state. As such, the electrons in the charge storage layer 22 over the proximity of the source 3 may be erased (or the holes may be injected into the charge storage layer 22).

Figure 8:
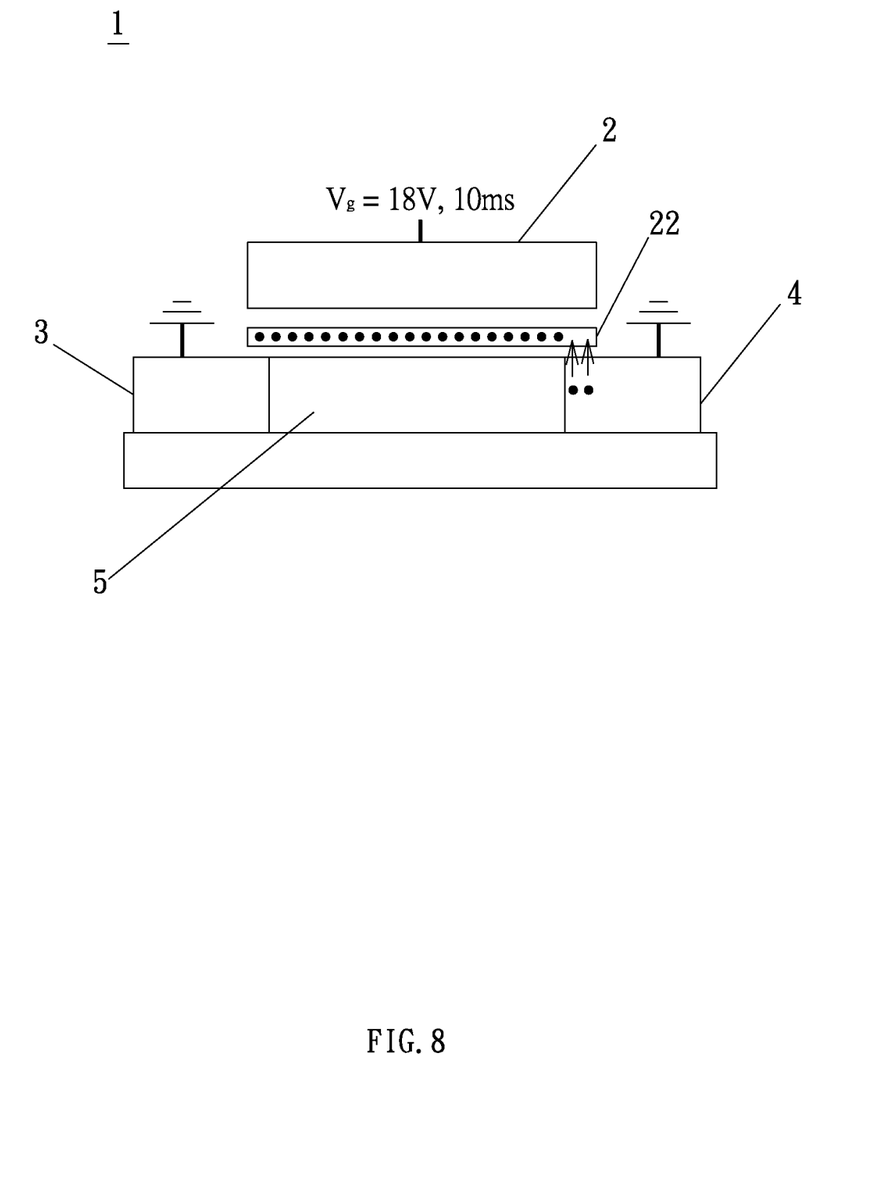
FIG. 8 is a diagram showing the programming operation according to one preferred embodiment of the present invention.
Figure 9:
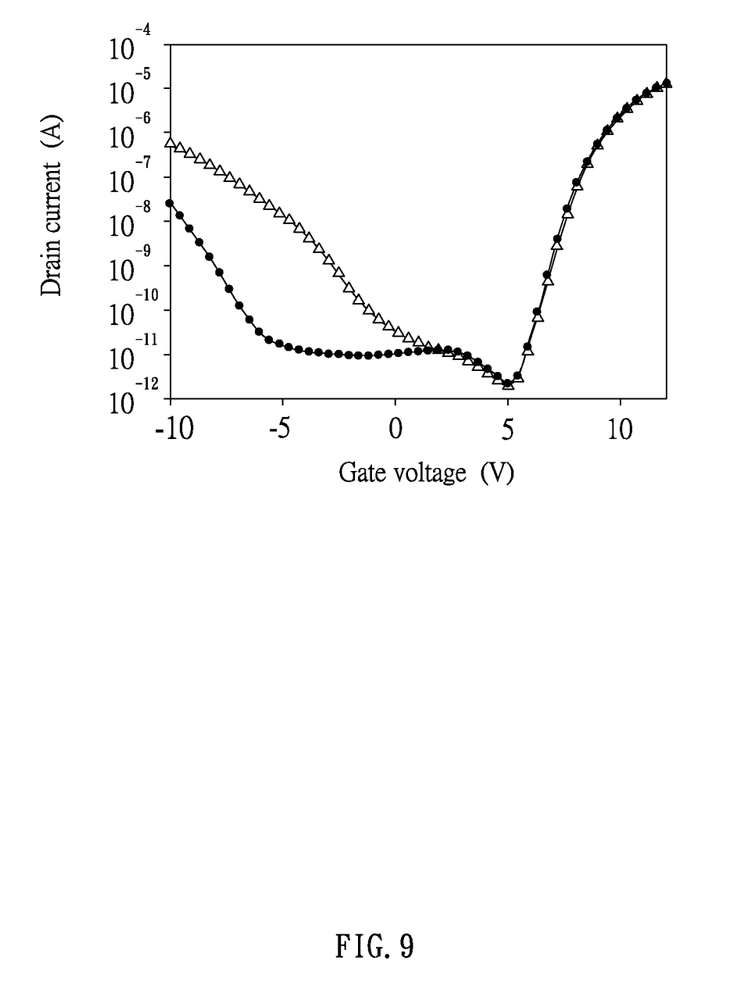
FIG. 9 is a diagram showing the current-voltage characteristics under the programming operation according to one preferred embodiment of the present invention.

Referring to FIGS. 8 and 9, there are shown in FIG. 8 a diagram of the programming operation according to one preferred embodiment of the present invention, and in FIG. 9 the current-voltage characteristics under the programming operation according to one preferred embodiment of the present invention. Here, FN tunneling, which is operated at a smaller bias voltage or for a shorter duration time during the gate is biased in comparison with the first operating voltage for the first operation, is used to increase the value of GIDL. Thus, electrons may be injected into the charge storage layer 22 above of the source 3 and the drain 4 again, and then GIDL increases. In this embodiment, a programming voltage, which is 18 volts, may be applied on the gate 2, and the duration time of this application is 10 ms. Moreover, the source 3 and the drain 4 are presented in the grounded state. The threshold voltage of the transistor 1 may be not affected, due to the fact that both the value of voltage and the duration time of the application of the programming voltage to the gate 2 are not sufficient for injecting a large number of electrons into the charge storage layer 22 over the channel. In operation, it is allowed to restrain and increase GIDL effectively by the use of this operation step, in which only the repeated erasing and programming operations are required. Further, the source 3 and the drain 4 may exhibit individual storage states, respectively, thus increasing memory density and achieving the two-bit effect, because the erasing and programming operation may be performed with respect to the source 3 and the drain 4, respectively.

Figure 10:
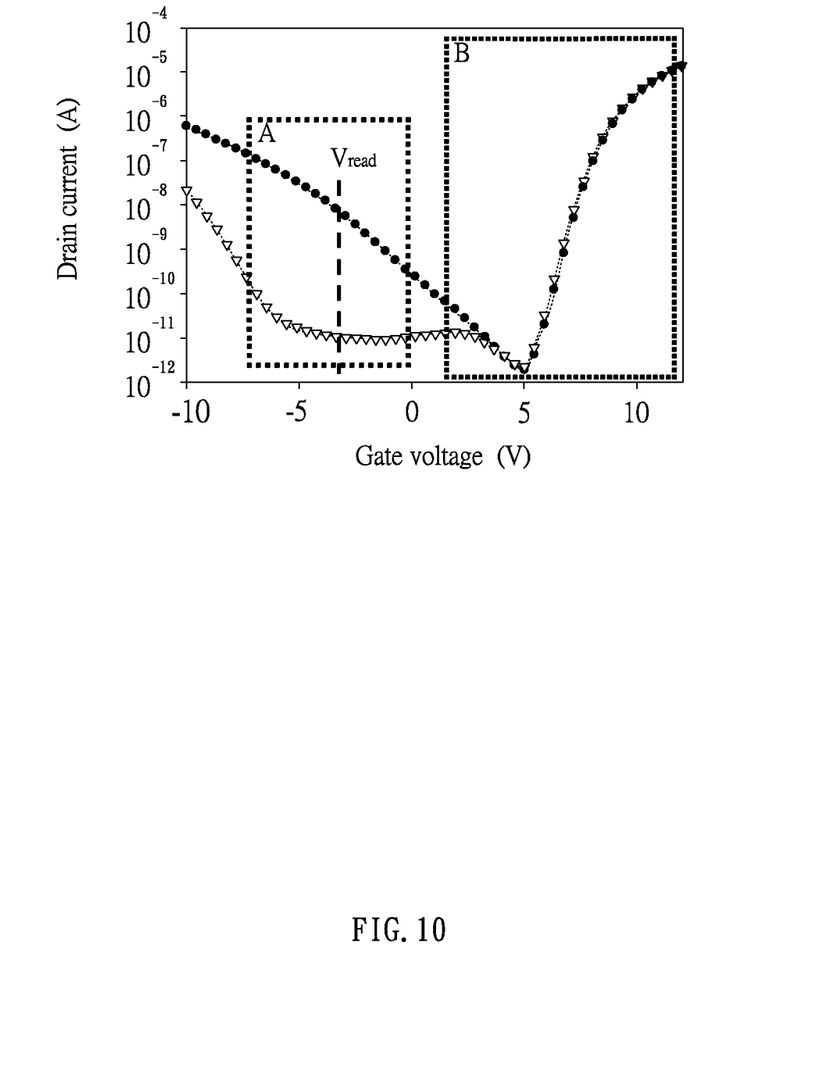
FIG. 10 is a current-voltage diagram illustrating the dual features of switch and memory according to one preferred embodiment of the present invention.

Referring to FIG. 10, it is shown a current-voltage diagram illustrating the dual features of switch and memory according to one preferred embodiment of the present invention. It may be found, in this current-voltage diagram, that the operation block A indicates a situation when the transistor 1 is used as a memory, while the operation B indicates a situation when it is used as a switch. In the switch mode, the transistor 1 may be presented in the turn-on state when a second operating voltage is determined larger than the second threshold voltage of the transistor 1. The transistor 1 may be presented in the turn-off state when the second operating voltage is determined smaller than the second threshold voltage of the transistor 1. Taking the drain 4 as an example, when operated in the operation block A to be used in the memory mode, the memory state of the drain 4 may be identified on the basis of variation in the detected GIDL, if the operating voltage of the transistor 1 may fall within the detecting range of GIDL. In practice operation, the source 3 is presented in the grounded state, while the drain 4 is applied with a voltage of 2V and the gate 1 is applied with a voltage of −5V. Then, source-drain current is measured. In contrast, the memory state of the source may be likewise determined.

The foregoing description is to be construed as illustrative only and non-restrictive. All equivalent modifications and variations made without departing from the spirit and scope of the invention are intended to be embraced in the appended claims.

The invention claimed is:

1. A method for enabling a SONOS transistor to be used as both a switch and a memory, said transistor comprising a gate, a source, a drain, and a charge storage layer, comprising steps of:
providing a first operating voltage to said gate in such a way that electrons are accumulated in said charge storage layer, and a threshold voltage of said transistor is increased from a first threshold voltage up to a second threshold voltage, the threshold voltage of said transistor maintains at said second threshold voltage stably;
performing a switch mode or a memory mode;
entering said switch mode, and then determining whether a second operating voltage provided on said gate is higher than said second threshold voltage, if the second operating voltage is higher than the second threshold voltage, said transistor switches into a turn-on state, and if the second operating voltage is not higher than the second threshold voltage, said transistor switches in a turn-off state;
entering said memory mode, and then determining a memory state of said transistor by applying a first determining voltage on said gate and providing a second determining voltage on said source or said drain;
performing a programming operation by applying a programming voltage on said gate with said source and said drain being grounded, wherein the programming voltage applied on said gate when performing said programming operation is smaller than the first operating voltage provided to said gate, such that a value of threshold voltage of said transistor will not be affected;
performing an erasing operation by applying an erasing voltage on one of said drain and said source, and the other of said drain and said source on which the erasing voltage is not applied is grounded,
wherein said switch mode and said memory mode are two independent modes and operations are ended after said modes have been performed;
wherein a first duration operating time for providing the first operating voltage to said gate is longer than a second duration operating time for applying the programming voltage on said gate when performing said programming operation.

2. The method according to claim 1, wherein, in the case of programming operation with respect to said transistor, said programming voltage is provided on said gate, while said drain and said source are presented in the grounded state, in such a way that electrons are injected into said charge storage layer.

3. The method according to claim 1, wherein, in the case of the erasing operation with respect to said transistor, said erasing voltage is provided on said source, while said gate and said drain are presented in the grounded state, in such a way that electrons in said charge storage layer above said source are erased.

4. The method according to claim 1, wherein, in the case of the erasing operation with respect to said transistor, said erasing voltage is provided on said drain, while said gate and said source are presented in the grounded state, in such a way that electrons in said charge storage layer above of said drain are erased.

5. The method according to claim 1, wherein said transistor is a field-effect transistor or thin-film transistor.

6. The method according to claim 1, wherein, when said transistor is used as the memory, said source and said drain are operated individually, thus providing said transistor with a two-bit memory effect.

7. The method according to claim 1, wherein said charge storage layer of said SONOS transistor is a silicon nitride layer, aluminum oxide layer, tantalum oxide layer, or titanium oxide layer.

8. A method for enabling a SONOS transistor to be used as both a switch and a memory, said transistor comprising a gate, a source, a drain, and a charge storage layer, comprising steps of:
providing a first operating voltage to said gate in such a way that electrons are accumulated in said charge storage layer, and a value of threshold voltage of said transistor is increased from a first threshold voltage up to a second threshold voltage, the threshold voltage of said transistor maintains at said second threshold voltage stably; performing a switch mode or a memory mode;
entering said switch mode, and then determining whether a second operating voltage provided on said gate is higher than said second threshold voltage, wherein said transistor switches into a turn-on state if the second operating voltage is higher than said threshold voltage, and said transistor switches into a turn-off state if the second operating voltage is not higher than said threshold voltage;
entering said memory mode, and then determining a memory state of said transistor by applying a first determining voltage on said gate and providing a second determining voltage on said source or said drain; and
performing a programming operation by applying a programming voltage on said gate with said source and said drain being grounded, wherein the programming voltage applied on said gate when performing said programming operation is smaller than the first operating voltage provided to said gate, such that the value of threshold voltage of said transistor will not be affected;

wherein said switch mode and said memory mode are two independent modes and operations are ended after said modes have been performed; and wherein a first duration operating time for providing the first operating voltage to said gate is longer than a second duration operating time for applying the programming voltage on said gate when performing said programming operation.

* * * * *